(12) United States Patent
Kim

(10) Patent No.: US 7,297,570 B2
(45) Date of Patent: Nov. 20, 2007

(54) COMPLEMENTARY METAL OXIDE SEMICONDUCTOR IMAGE SENSOR AND METHOD FOR FABRICATING THE SAME

(75) Inventor: Shang Won Kim, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/022,858

(22) Filed: Dec. 28, 2004

(65) Prior Publication Data

US 2006/0011932 A1 Jan. 19, 2006

(30) Foreign Application Priority Data

Jul. 15, 2004 (KR) .................. 10-2004-0055107

(51) Int. Cl.
*H01L 27/14* (2006.01)
*G02B 5/22* (2006.01)
*H04N 5/335* (2006.01)

(52) U.S. Cl. ..................... 438/70; 438/60; 438/75; 438/E27.134; 438/E31.127; 250/208.1; 250/216; 250/226

(58) Field of Classification Search .............. 257/98, 257/79, 431–432; 438/60, 69–70, 75; 250/208.1, 250/216, 226
See application file for complete search history.

(56) References Cited

U.S. PATENT DOCUMENTS 5,306,926 A * 4/1994 Yonemoto ................. 257/432
5,672,519 A * 9/1997 Song et al. ................ 438/69
6,040,591 A * 3/2000 Otsuka ..................... 257/232
6,188,094 B1 * 2/2001 Kochi et al. .............. 257/232
6,583,438 B1 * 6/2003 Uchida ..................... 257/59
6,586,811 B2 * 7/2003 Sekine ...................... 257/432
2006/0033176 A1* 2/2006 Mun ......................... 257/462

FOREIGN PATENT DOCUMENTS

| JP | 06-053458 | | 2/1994 |
| JP | 10-209421 | | 8/1998 |
| JP | 11-274443 | | 10/1999 |
| JP | 2002-246579 | * | 8/2002 |
| JP | 2002-314058 | | 10/2002 |
| JP | 2003-060176 | | 2/2003 |
| JP | 2003-318374 | * | 11/2003 |
| KR | 2001-0061335 A | | 7/2001 |
| KR | 2004-003166 | * | 1/2004 |

* cited by examiner

*Primary Examiner*—Anh Duy Mai
(74) *Attorney, Agent, or Firm*—Finnegan, Henderson, Farabow, Garrett & Dunner, L.L.P.

(57) ABSTRACT

A CMOS image sensor and a method for fabricating the same is disclosed, to enhance the efficiency in condensing the light by forming a multi-layered micro lens with various materials having different refractive indexes, in which the CMOS image sensor includes a plurality of photosensitive devices on a semiconductor substrate; an insulating interlayer on the plurality of photosensitive devices; a plurality of color filter layers in correspondence with the respective photosensitive devices, to filter the light by respective wavelengths; a first micro-lens layer on an entire surface of the color filter layers, to condense the light; and a plurality of second micro-lens layers on the first micro-lens layer in correspondence with the respective photosensitive devices, wherein the second micro-lens layer has the different refractive index from that of the first micro-lens layer.

4 Claims, 4 Drawing Sheets

COMPLEMENTARY METAL OXIDE SEMICONDUCTOR IMAGE SENSOR AND METHOD FOR FABRICATING THE SAME

CROSS-REFERENCE TO RELATED APPLICATIONS

This application claims the benefit of Korean Application No. P2004-55107, filed on Jul. 15, 2004, which is hereby incorporated by reference as if fully set forth herein.

BACKGROUND OF THE INVENTION

1. Field of the Invention

The present invention relates to an image sensor, and more particularly, to a CMOS (complementary metal oxide semiconductor) image sensor and a method for fabricating the same, to enhance the efficiency in condensing the light by forming a multi-layered micro lens with various materials having different refractive indexes.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

The CMOS image sensor is provided with a photodiode PD for sensing the light, and a CMOS logic circuit for converting the sensed light to data of electric signals. At this time, as the amount of sensed light increases, photosensitivity of the image sensor improves.

In order to improve the photosensitivity, there is requirement for enhancing a fill factor of occupying a photodiode area in an entire area of the image sensor, or for condensing the light to the photodiode by changing the light-path of the light incident on the remaining areas except the photodiode.

For example, a micro-lens may be provided to condense the light. That is, a convex micro-lens is provided above the photodiode, wherein the convex micro-lens is formed of a material having great transmittance. As a result, the incident light is refracted by the convex micro-lens, whereby it is possible to provide more light to the photodiode. In this case, the light parallel to an optical axis of the micro-lens is refracted by the micro-lens, so that a focus is formed at a predetermined point of the optical axis.

Hereinafter, a related art CMOS image sensor and a method for forming a micro-lens therein will be described with reference to the accompanying drawings.

FIG. 1 is a schematic view of a related art micro-lens of a CMOS image sensor.

As shown in FIG. 1, a related art CMOS image sensor includes photodiode areas 11, an insulating interlayer 12, a protective layer 13, an R/G/B color filter layer 14, a top-coating layer 15, and a convex micro-lens 16. At this time, at least one photodiode area 11 is formed on a semiconductor substrate (not shown) to generate electric charges dependent on the amount of incident light. Also, the insulating interlayer 12 is formed on an entire surface of the semiconductor substrate (not shown) including the photodiode areas 11, and the protective layer 13 is formed on the insulating interlayer 12. Then, the R/G/B color filter layer 14 is formed on the protective layer 13 so as to transmit the light by respective wavelengths, and the top-coating layer 15 is formed on the R/G/B color filter layer 14. The convex micro-lens 16 having a predetermined curvature is provided on the top-coating layer 15, so as to condense the light passing through the R/G/B color filter layer 14 to the photodiode areas 11.

Although not shown, an optical shielding layer is provided in the insulating interlayer 12, wherein the optical shielding layer prevents the light from being incident to the remaining areas except the photodiode areas 11.

At this time, it is possible to provide a photogate instead of the photodiode.

Herein, the curvature and the height ('A' of FIG. 1) of the convex micro-lens 16 are determined in due consideration of the focus of the condensed light. Also, the micro-lens 16 is generally formed of polymer type resin, which is formed in a sequential process of deposition, patterning, and reflow. That is, the optimal size, curvature and thickness of the micro-lens 16 are determined in due consideration of position and shape of a unit pixel region, thickness of a photosensitive device, and height, position and size of the optical shielding layer.

On fabrication of the related art CMOS image sensor, the micro-lens 16 is a very important component for enhancing the light-condensing efficiency. The micro-lens 16 is provided to condense more light to the photodiode area 11 through the color filter layer 14 when the ambient light is irradiated.

The light incident on the image sensor is condensed by the micro-lens 16, and then is filtered through the color filter layer. After that, the filtered light is incident on the photodiode area 11 provided below the color filter layer 14. At this time, the optical shielding layer prevents the incident light from getting out of the path.

However, the micro-lens of the related art CMOS image sensor has the following disadvantages.

The light parallel to the optical axis of the micro-lens is refracted and transmitted to the photosensitive device being opposite to the micro-lens, thereby operating the device. However, the light being not parallel to the optical axis of the micro-lens is refracted and transmitted to the photosensitive device not to receive the light, whereby the device has misoperation.

Also, the amount of light transmitted to the photosensitive device is varied on the kind and thickness of the lower layer positioned below the micro-lens, whereby the light-condensing efficiency lowers, thereby deteriorating the picture quality.

SUMMARY OF THE INVENTION

Accordingly, the present invention is directed to a CMOS image sensor and a method for fabricating the same that substantially obviate one or more problems due to limitations and disadvantages of the related art.

An object of the present invention is to provide a CMOS image sensor and a method for fabricating the same, to enhance the efficiency in condensing the light by forming a multi-layered micro lens with various materials having different refractive indexes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a plurality of photosensitive devices on a semiconductor substrate; an insulating interlayer on the plurality of photosensitive devices; a plurality of color filter layers in correspondence with the respective photosensitive devices, to filter the light by respective wavelengths; a first micro-lens layer on an entire surface of the color filter layers, to condense the light; and a plurality of second micro-lens layers on the first micro-lens layer in correspondence with the respective photosensitive devices, wherein the second micro-lens layer has the different refractive index from that of the first micro-lens layer.

In another aspect, a method for fabricating a CMOS image sensor includes steps of forming an insulating interlayer on a semiconductor substrate having a plurality of photosensitive devices; forming color filter layers on the insulating interlayer in correspondence with the respective photosensitive devices; forming a first micro-lens layer on the color filter layers; and forming a second micro-lens layer on the first micro-lens layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for fabricating the same according to the present invention will be described with reference to the accompanying drawings.

Figure 2:
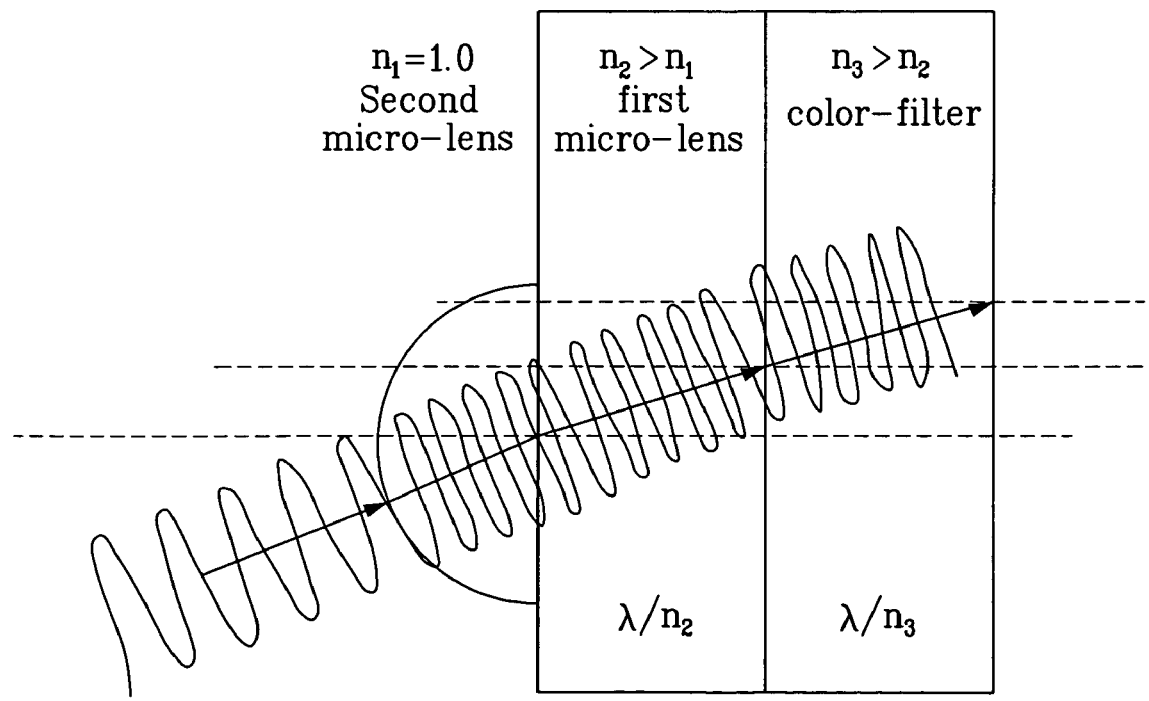
FIG. 2 shows the light-path dependent to changes of refractive indexes varied on the medium.

FIG. 2 shows the light-path dependent to changes of refractive indexes varied on the medium. As shown in FIG. 2, if depositing material layers having different refractive indexes, it results in refraction of light. Supposing that one material layer of a first refractive index is deposited on another material layer of a second refractive index, wherein the first refractive index is lower than the second refractive index. In this state, when the light is incident from the material layer of the low refractive index to the material layer of the high refractive index, a transmission angle decreases.

Referring to FIG. 2, on the assumption that a second micro-lens layer has a first refractive index (n1), a first micro-lens layer has a second refractive index (n2; n2>n1), and a color filter layer has a third refractive index (n3; n3>n2), the transmission angle of the light is changed in order of θ1>θ2>θ3. This means that the light is more condensed on the center axis.

Figure 3:
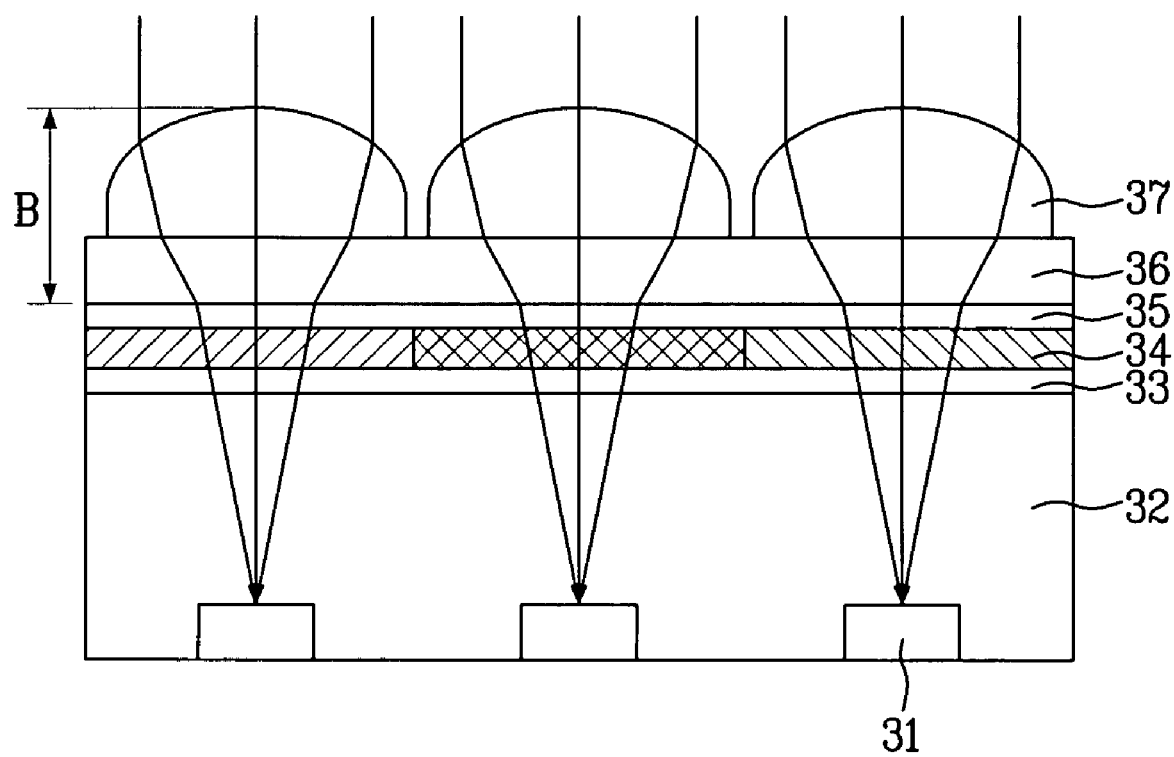
FIG. 3 shows a CMOS image sensor according to the present invention.
Figure 4A:
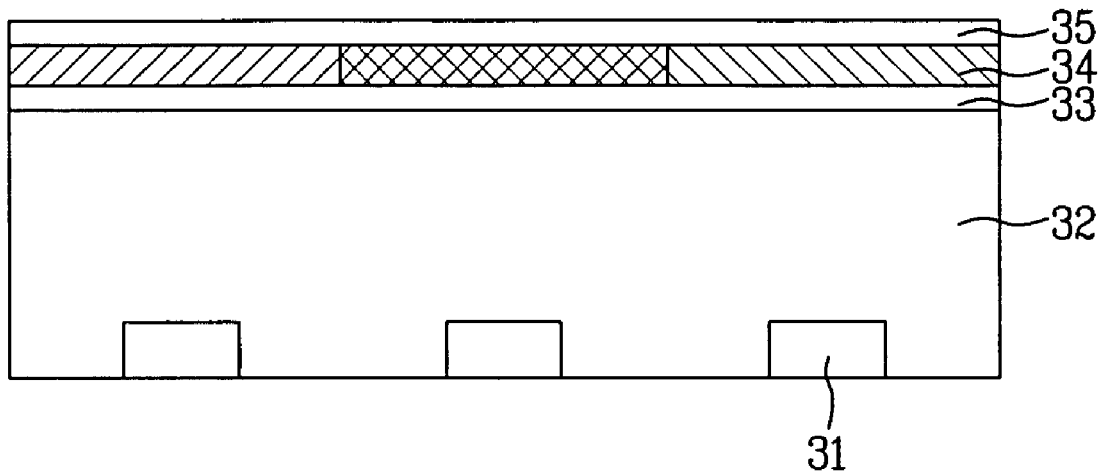
FIG. 4A to FIG. 4C show cross sectional views of the fabrication process for a CMOS image sensor according to the present invention.
Figure 4B:
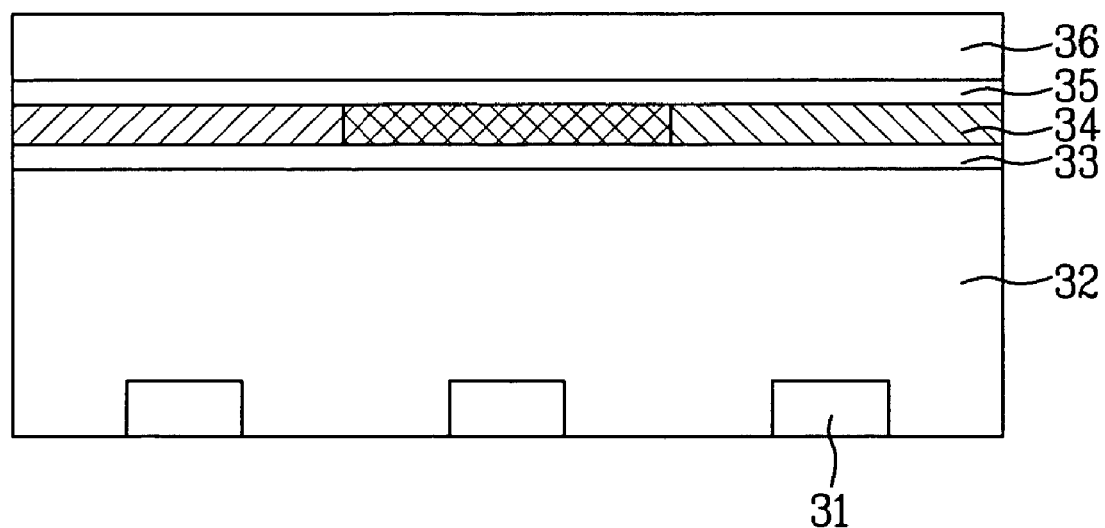
Figure 4C:
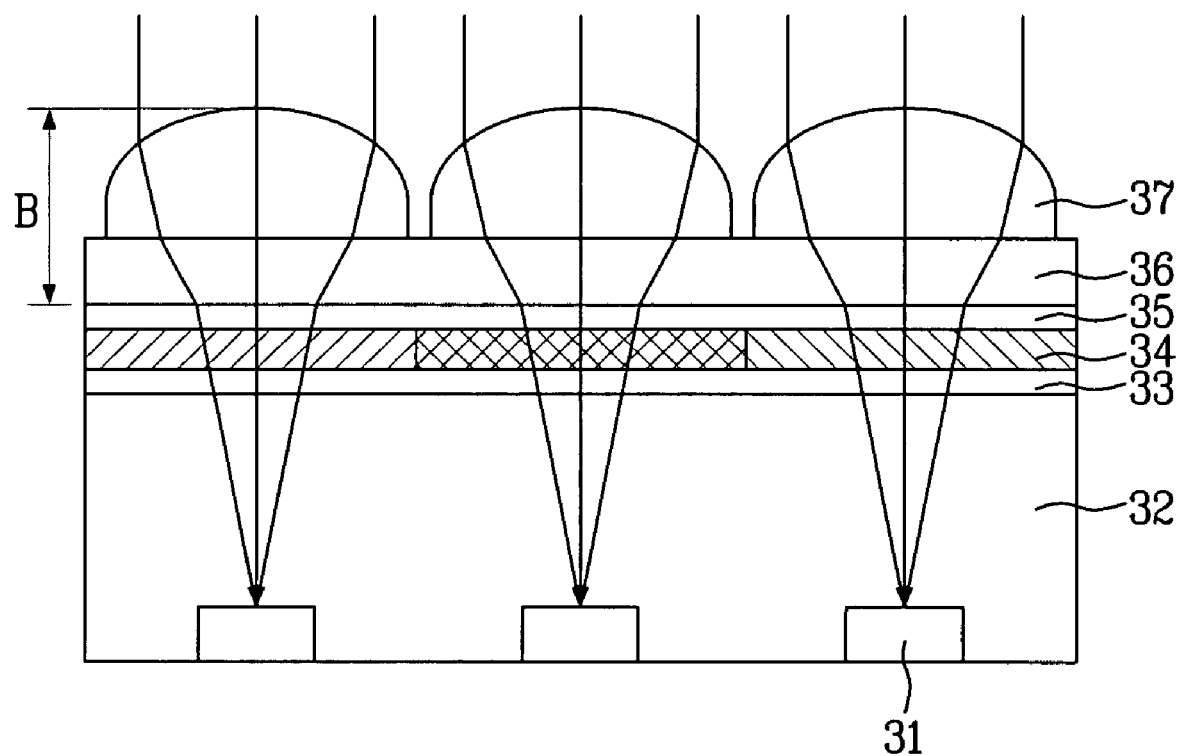

A CMOS image sensor and a method for fabricating the same according to the present invention will be described as follows. FIG. 3 shows a CMOS image sensor according to the present invention. FIG. 4A to FIG. 4C show cross sectional views of the fabrication process for a CMOS image sensor according to the present invention.

First, for example, the CMOS image sensor includes a plurality of photosensitive devices, for example, photodiodes 31, formed on a semiconductor substrate, an insulating interlayer 32, a protective layer 33, color filter layers 34, a top-coating layer 35, a first micro-lens layer 36, and second micro-lens layers 37. At this time, the insulating interlayer 32 is formed on the photodiodes 32, and the protective layer 33 is formed on the insulating interlayer 32. Also, the color filter layers 34 are formed on the protective layer 33 in correspondence with the photodiodes 31, so as to irradiate the filtered light of particular wavelengths to the photodiodes 31. Then, the top-coating layer 35 is formed to obtain a planar surface in the color filter layers 34. The first micro-lens layer 36 is formed on an entire surface of the top-coating layer 35 on the color filter layers 34. The second micro-lens layers 37 are formed on the first micro-lens layer 36 in correspondence with the respective photodiodes 31, wherein the second micro-lens layers 37 have the different refractive index from that of the first micro-lens layer, so as to condense the light.

Herein, in case the refractive index of the color filter layers 34 is referred to as 'n3', the refractive index of the first micro-lens layer 36 is referred to as 'n2', and the refractive index of the second micro-lens layers 37 is referred to as 'n1', the refractive indexes are in the state of n3>n2>n1.

The second micro-lens layers 37 are formed in shape of convex hemisphere, and the first micro-lens layer 36 is formed flat on the entire surface of the top-coating layer 35. Also, the second micro-lens layers 37 are formed of photoresist, and the first micro-lens layer 36 is formed of an oxide layer, for example, TEOS (Tetra Ethyl Ortho Silicate).

In the CMOS image sensor according to the present invention, the color filter layers 34, the first micro-lens layer 36, and the second micro-lens layers 37 are formed of the different materials having different refractive indexes, whereby the light incident on the photodiodes is refracted three times, thereby improving the efficiency in condensing the light.

Figure 1:
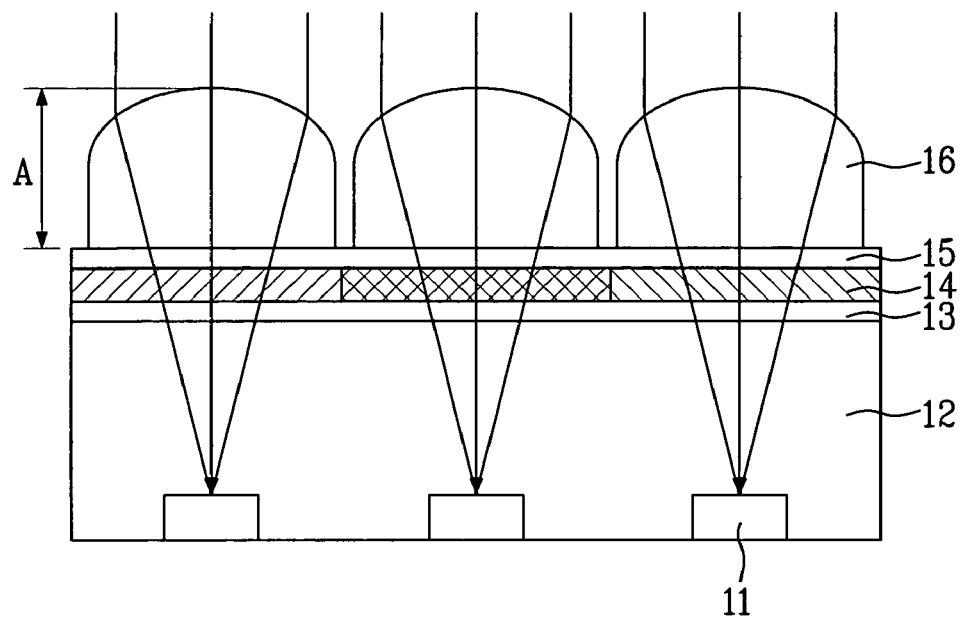
FIG. 1 shows a micro-lens of a related art COS image sensor.

The total thickness of the first micro-lens layer 36 and the second micro-lens layers 37 may be the same as the thickness of 'A' in FIG. 1 (A=B), or may be smaller than the thickness of 'A' in FIG. 1 (A>B), since it is possible to control the focal distance by improving the light-condensing efficiency even though the thickness of the micro-lens layer decreases.

A method for fabricating the CMOS image sensor according to the present invention will be described as follows.

On the fabrication process of the micro-lens on the surface of the semiconductor device of the CMOS image sensor, before forming the hemispherical micro-lens after the color filter layer formation process and the planarization process, the material layer having the higher refractive index than that of the photoresist for forming the hemispherical micro-lens is firstly formed, for example, the oxide layer, and then the hemispherical micro-lens are formed.

At this time, the first and second micro-lens layers 36 and 37 may be respectively formed of the oxide layer and the photoresist. Or, the first and second micro-lens layers 36 and 37 may be formed of the oxide layers having the different refractive indexes, or of the photoresist having the different refractive indexes.

On the fabrication process, as shown in FIG. 4A, firstly, the plurality of photosensitive devices, for example, the photodiodes 31 are formed on the semiconductor substrate, and then the insulating interlayer 32 is formed thereon. At this time, the insulating interlayer 32 may have a multi-layered structure. Although not shown, after forming a single-layered insulating interlayer, an optical shielding layer may be formed to prevent the light from being incident on the remaining portions except the photodiodes 31, and then the additional insulating interlayer may be formed thereon.

Subsequently, the protective layer 33 is formed flat on the insulating interlayer 32, to protect the device from moisture and scratch. Then, the color filter layers 34 are formed on the protective layer 33, wherein the color filter layers 34 filter the light by the respective wavelengths. At this time, the color filter layers 34 are formed of the dyeable photoresist by the coating and patterning process. After that, the top-coating layer 35 is formed on the color filter layers 33, so as to obtain the planar surface of the color filter layers 34 for controlling the focal distance and forming the micro-lens layers.

Then, as shown in FIG. 4B, the photoresist for forming the micro-lens layer, having the lower refractive index than that of the color filter layers 34, or the oxide layer such as TEOS is formed on the top-coating layer 35, thereby forming the first micro-lens layer 36.

Referring to FIG. 4C, the material layer for forming the micro-lens layer, having the different refractive index from that of the first micro-lens layer 36, for example, the photoresist or the oxide layer, is deposited on the first micro-lens layer 36, and then the patterning and reflowing process is performed thereon, whereby the second micro-lens layers 37 are formed in correspondence with the respective photodiodes 31.

Herein, in case the refractive index of the color filter layers 34 is referred to as 'n3', the refractive index of the first micro-lens layer 36 is referred to as 'n2', and the refractive index of the second micro-lens layers 37 is referred to as 'n1', the refractive indexes are in the state of n3>n2>n1.

The CMOS image sensor according to the present invention uses the principle of light having the smaller transmission angle as progressing from the low refractive index material to the high refractive index material.

Accordingly, the light-condensing efficiency improves as the light passes through the second micro-lens layers 37 and the first micro-lens layer 36. Further, according as the light passes through the second micro-lens layers 37 and the first micro-lens layer 36, it is possible to improve the resolution in the color filter layers 34.

Also, if there is any problem after the reflow thermal process to form the micro-lens layer, it is necessary to perform a rework process. In this case, since the micro-lens layer is formed in the multi-layered structure, the rework process is performed from the micro-lens formation process, thereby realizing the simplified fabrication process and the decreased fabrication cost.

Accordingly, the CMOS image sensor and the method for fabricating the same according to the present invention have the following advantages.

First, the micro-lens layer is formed in the multi-layered structure using the different medium of the different refractive indexes, whereby it is possible to obtain the higher light-condensing efficiency than that of a related art single-layered micro-lens layer.

Also, it is possible to increase the amount of light passing through the color filter layers and being incident on the photodiodes, thereby improving the resolution.

In addition, the micro-lens layer is formed in the multi-layered structure. Accordingly, even if there is requirement for the rework process due to the thermal process, the rework process is performed not from the color filter formation process but from the micro-lens formation process, thereby realizing the simplified fabrication process and the decreased fabrication cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a CMOS image sensor comprising:
    forming an insulating interlayer on a semiconductor substrate having a plurality of photosensitive devices;
    forming color filter layers having a first refractive index on the insulating interlayer in correspondence with the respective photosensitive devices;
    forming a first micro-lens layer having a second refractive index to have a flat shape and to cover substantially an entire surface of the color filter layers; and
    forming a second micro-lens layer having a third refractive index on the first micro-lens layer;
    wherein the first refractive index is greater than the second refractive index, and the second refractive index is greater than the third refractive index.

2. The method of claim 1, wherein the first and second micro-lens layers are respectively formed of an oxide layer and a photoresist, or are formed of any one material having the different refractive indexes.

3. The method of claim 1, further comprising,
    forming a protective layer between the insulating interlayer and the color filter layers.

4. The method of claim 1, further comprising,
    forming a top-coating layer between the color filter layers and the first micro-lens layer.

* * * * *